(12) United States Patent
Park et al.

(10) Patent No.: US 7,484,167 B2
(45) Date of Patent: Jan. 27, 2009

(54) ERROR DETECTION USING CODES TARGETED TO PRESCRIBED ERROR TYPES

(75) Inventors: Jihoon Park, San Jose, CA (US); Jaekyun Moon, Plymouth, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 509 days.

(21) Appl. No.: 11/169,159

(22) Filed: Jun. 28, 2005

(65) Prior Publication Data
US 2006/0080587 A1 Apr. 13, 2006

Related U.S. Application Data

(60) Provisional application No. 60/617,307, filed on Oct. 8, 2004.

(51) Int. Cl.
*G06F 11/00* (2006.01)
(52) U.S. Cl. .................... 714/801; 714/776; 714/758
(58) Field of Classification Search ................ 714/801, 714/776
See application file for complete search history.

(56) References Cited

U.S. PATENT DOCUMENTS

| | | | | |
|---|---|---|---|---|
| 5,949,796 | A * | 9/1999 | Kumar | 370/529 |
| 6,243,847 | B1 * | 6/2001 | McClellan et al. | 714/800 |
| 6,246,698 | B1 * | 6/2001 | Kumar | 370/487 |
| 6,282,690 | B1 * | 8/2001 | McClellan et al. | 714/801 |
| 6,618,452 | B1 * | 9/2003 | Huber et al. | 375/343 |
| 2001/0050926 | A1 * | 12/2001 | Kumar | 370/529 |

OTHER PUBLICATIONS

B. Valcu et al., "Pulse Shape, Resolution, and Signal-to-Noise Ratio in Perpendicular Recording," IEEE Transactions on Magentics, vol. 38, No. 1, pp. 288-294, January 2002.
E.R. Berlekamp et al., "The Application of Error Control to Communications," IEEE Communications Magazine, vol. 25, No. 4, pp. 44-57, Apr. 1987.
H. Sawaguchi et al., "Performance Analysis of Modified PRML Channels for Perpendicular Recording Systems," Journal of Magnetism and Magnetic Materials, vol. 235, Nos. 1-3, pp. 265-272, Oct. 1, 2001.

(Continued)

*Primary Examiner*—Mujtaba K Chaudry
(74) *Attorney, Agent, or Firm*—Shumaker & Sieffert, PA

(57) ABSTRACT

Techniques are described for detecting error events in codewords detected from data signals transmitted via a communication system. The error events are detected with an error detection code that corresponds to one or more dominant error events for the communication system. The invention develops a class of error detection codes to detect specific error events of known types. In some embodiments, the communication system comprises a recording system. The error detection coding method may be used in conjunction with error correction processing to provide substantial performance gain compared to conventional parity-based post processing methods. For example, the error correction processing may include one or more correlation filters that correspond to the one or more dominant error events for the communication system. A correction module may correct the codeword based on a type of the detected error event and a location of the detected error event in the codeword.

47 Claims, 6 Drawing Sheets

OTHER PUBLICATIONS

J. Caroselli et al., "Error Event Characterization of Partial Response Systems in Magnetic Recording Systems with Medium Noise," IEEE GLOBECOM '98, pp. 2724-2729, 1998.

J. Moon et al., "Performance Comparison of Detection Methods in Magnetic Recording," IEEE Transactions on Magnetics, vol. 26, No. 6, pp. 3155-3172, Nov. 1990.

J. Moon, "Discrete-Time Modeling of Transition-Noise-Dominant Channels and Study of Detection Performance," IEEE Transactions on Magnetics, vol. 27, No. 6, pp. 4573-4578, Nov. 1991.

J. Moon, "Signal-to-Noise Ratio Definition for Magnetic Recording Channels with Transition Noise," IEEE Transactions on Magnetics, vol. 36, No. 5, pp. 3881-3883, Sep. 2000.

K. Saeki et al, "Optimal Combination of Detection and Error Correction Coding for Magnetic Recording," IEEE Transactions on Magentics, vol. 37, No. 2, pp. 708-713, Mar. 2001.

M. Madden et al., "Read Channel for Perpendicular Magnetic Recording," IEEE Transactions on Magnetics, vol. 40, No. 1, pp. 241-246, Jan. 2004.

P. Kovintavewat et al., "Generalized Partial-Response Targets for Perpendicular Recording with Jitter Noise," IEEE Transactions on Magnetics, vol. 38, No. 5, pp. 2340-2342, Sep. 2002.

R.D. Cideciyan et al., "Noise Predictive Maximum Likelihood Detection Combined with Parity-Based Post-Processing," IEEE Transactions on Magnetics, vol. 37, No. 2, pp. 714-720, Mar. 2001.

T. Conway, "A New Target Response with Parity Coding for High Density Magnetic Recording Channels," IEEE Transactions on Magnetics, vol. 34, No. 4, pp. 2382-2386, Jul. 1998.

T. Oenning et al., "Modeling the Lorentzian Magnetic Recording Channel with Transition Noise," IEEE Transactions on Magnetics, vol. 37, No. 1, pp. 583-591, Jan. 2001.

W. Feng et al., "On the Performance of Parity Codes in Magnetic Recording Systems," IEEE GLOBECOM 2000, pp. 1877-1881, 2000.

W.G. Bliss et al., "Sector Error Rate Estimation of Concatenated Codes in Magnetic Recording," IEEE International Conference on Communications Record, pp. 2726-2730, 2001.

Z.A. Keirn et al., "Use of Redundant Bits for Magenetic Recording: Single-Parity Codes and Reed-Solomon Error-Correcting Code," IEEE Transactions on Magnetics, vol. 40, No. 1, pp. 225-230, Jan. 2004.

J. Moon et al., "Equalization for Maximum Likelihood Detectors," IEEE Transactions on Magnetics, vol. 31, No. 2, pp. 1083-1088, Mar. 1995.

* cited by examiner

ERROR DETECTION USING CODES TARGETED TO PRESCRIBED ERROR TYPES

This application claims the benefit of U.S. Provisional Application Ser. No. 60/617,307, filed Oct. 8, 2004, the entire content of which is incorporated herein by reference.

TECHNICAL FIELD

The invention relates to communication systems and, more particularly, error detection coding techniques useful in communication systems.

BACKGROUND

Error detection and correction is an important feature of most modern communication systems, including wired and wireless telecommunication systems and data recording systems. Communication systems, such as data recording systems, use a variety of error detection coding techniques to permit correction of bit errors in transmitted symbols. For example, magnetic recording systems, such as tape drives or disk drives, read data from a magnetic medium with a read head and transmit the recovered data to a signal processor, such as a Viterbi detector. Magnetic recording systems typically include error detection coding and error correction to ensure accuracy of the detected data sequences.

Magnetic media, such as magnetic hard drives, magnetic diskettes, magnetic tapes, magnetic tape cartridges, and magnetic-optical disks, can be categorized as either longitudinal or perpendicular. Most conventional magnetic media are longitudinal. In longitudinal media, magnetic anisotropy extends parallel to the plane of the medium. In other words, in longitudinal media, the magnetic orientation of individual magnetic domains is generally parallel to the surface of the medium. In perpendicular media, on the other hand, magnetic anisotropy is perpendicular to the plane of the medium. In particular, in perpendicular media, the magnetic orientation of individual magnetic domains is perpendicular to the medium surface. Perpendicular media allows for a much higher storage density than can be achieved in longitudinal media.

Error detection coding in a magnetic recording system may include a parity bit check. For example, the most significant error events in longitudinal media contain an odd number of erroneous bits. Therefore, the magnetic recording system may include a single parity bit check to detect the error events. However, in perpendicular media, the critical error events may take different forms, as the intersymbol interference (ISI) characteristics are substantially different from those present in longitudinal media. Therefore, a single parity bit check may not be able to detect most of the error events in perpendicular media.

SUMMARY

In general, this disclosure describes techniques for detecting error events in codewords detected from data signals transmitted via a communication system. The error events are detected with an error detection code that corresponds to one or more dominant error events for the communication system. A class of error detection codes are provided to detect specific error events of known types. In this manner, the error detection techniques described in this disclosure permit targeted detection of specific error events. The codewords may comprise data words encoded with one or more parity bits and the error detection codes may comprise parity check codes. In some embodiments, the communication system may be or form part of a data recording system.

The error detection coding method may be used in conjunction with error correction processing to provide performance gains compared to conventional parity-based post processing methods. For example, the error correction processing may include one or more correlation filters that correspond to the one or more dominant error events for the communication system. A type and a location of an error event detected in the codeword may be determined by selecting a maximum value from the output of the correlation filters. A correction module may correct the codeword based on the type of the detected error event and the location of the detected error event in the codeword.

In one embodiment, the invention is directed to a method comprising detecting an occurrence of an error event in a codeword with an error detection code that corresponds to one or more dominant error events prescribed for a communication system.

In another embodiment, the invention is directed to a processor comprising an error event detector to detect an occurrence of an error event in a codeword with an error detection code that corresponds to one or more dominant error events prescribed for a communication system.

In another embodiment, the invention is directed to a computer-readable medium comprising instructions. The instructions, when executed in a processor, detect an occurrence of an error event in a codeword with an error detection code that corresponds to one or more dominant error events prescribed for a communication system.

In a further embodiment, the invention is directed to a magnetic recording system comprising a magnetic medium, a read head positioned adjacent the magnetic medium to read data from the magnetic medium, and an encoding module to encode the data recovered by the read head. The magnetic recording system also comprises a signal processor to detect a codeword from the encoded data and detect an occurrence of an error event in the codeword with an error detection code that corresponds to one or more dominant error events prescribed for the magnetic recording system.

The invention may be capable of providing a number of advantages. In some embodiments, for example, the error detection coding and correction techniques described herein can provide a substantial performance gain compared to conventional parity-based post processing methods. In the case of data recording systems, the error detection technique allows low cost, low power deployment of read channel processing. Furthermore, the invention can be used to develop error detection coding for any set of prescribed error events. The techniques disclosed herein may be applied to perpendicular recording systems and longitudinal recording systems, as well as other communication systems having channels characterized by specific error events.

The details of one or more embodiments of the invention are set forth in the accompanying drawings and the description below. Other features, objects, and advantages of the invention will be apparent from the description and drawings, and from the claims.

DETAILED DESCRIPTION

This disclosure describes techniques for detecting error events in codewords carried by data signals transmitted via a communication system. The error events are detected with an error detection code that corresponds to one or more dominant error events for the communication system. In some embodiments, the invention may rely on a class of error detection codes that are developed to detect prescribed error events. The error detection coding method may be used in conjunction with error correction processing to provide performance gains compared to conventional parity-based post-processing methods. In some cases, the communication system may comprise a data recording system.

Conventional methods of error detection and correction typically attempt to detect and correct as many erroneous bits as possible within a codeword, irrespective of the pattern of the error events. In contrast, the error detection coding techniques described herein are less concerned about the total number of erroneous bits detected, and instead focus on detecting prescribed error events. In particular, the techniques make use of error detection codes that are targeted to particular error types.

As an example, the technique may be applied to perpendicular magnetic recording systems. Distance analyses and simulation reveal that, in perpendicular magnetic media, dominant error events take the form ±{+−} and ±{+−0+−} at medium to high linear densities, and ±{+−0 0+−} at very high linear densities. Hence, perpendicular magnetic media is characterized by specific types of error event patterns. For these types of error events, a standard parity check may not reveal the error because the parity value does not actually change.

The above nomenclature refers to an erroneous change in bit value, from the original values to the detected values. For example, ±{+−} indicates an erroneous change in two bits, ±{+−0+−} indicates erroneous changes in two bit values, followed by a correct bit, and then followed by erroneous changes in two bit values, and ±{+−0 0+−} indicates erroneous changes in two bit values, followed by two correct bits, and then followed by erroneous changes in two bit values. In each case, the parity value remains unchanged because the patterns include erroneous bit value changes that offset one another.

Figure 1:
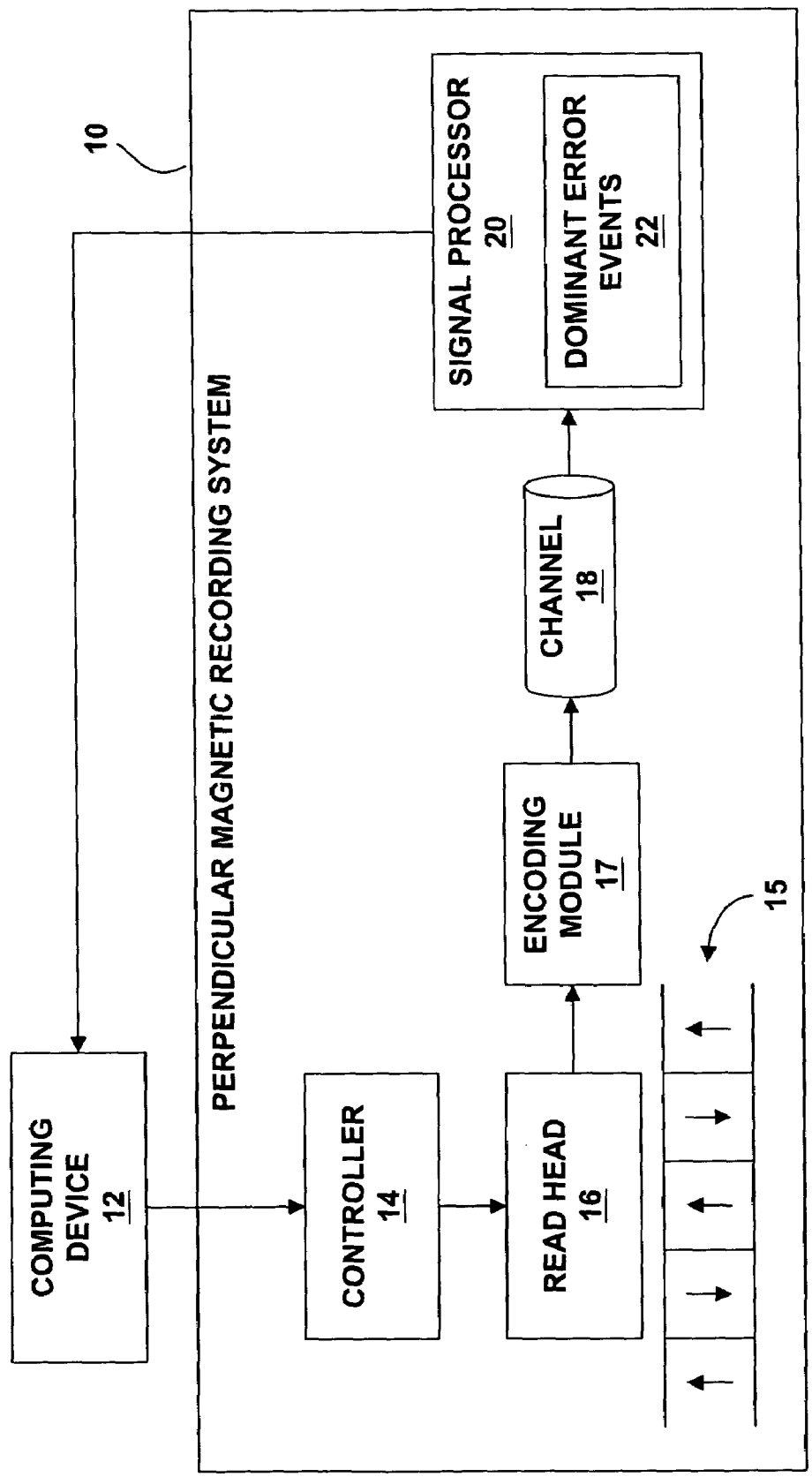
FIG. 1 is a block diagram illustrating a magnetic recording system.

FIG. 1 is a block diagram illustrating a magnetic recording system 10 in accordance with an embodiment of the invention. For purposes of illustration, the invention will be described herein as relating to a perpendicular magnetic recording system. However, the invention may also apply to longitudinal magnetic recording systems and other communication systems having data transmission channels characterized by specific error events that may not be detected using conventional parity check techniques.

A computing device 12 hosts perpendicular magnetic recording system 10. In the example of FIG. 1, system 10 comprises a perpendicular magnetic tape drive. In other embodiments, magnetic recording system 10 may comprise a perpendicular magnetic hard drive, a perpendicular magnetic disk drive, or a perpendicular magnetic tape cartridge drive. Recording system 10 includes a controller 14, a read head 16, an encoding module 17, a read channel 18, and a signal processor 20. Recording system 10 receives a magnetic medium 15. In the illustrated embodiment, magnetic medium 15 comprises a perpendicular magnetic tape.

In general, magnetic media includes magnetic diskettes, magnetic tapes, magnetic tape cartridges, hybrid magnetic media such as magnetic-optical disks, and the like. Magnetic media can be categorized as longitudinal or perpendicular. Most conventional magnetic media are longitudinal. In longitudinal media, magnetic anisotropy extends parallel to the plane of the medium, i.e., the magnetic orientation of individual magnetic domains is generally parallel to the surface of the medium. In perpendicular media, in contrast, magnetic anisotropy is perpendicular to the plane of the medium such that magnetic orientation of individual magnetic domains is perpendicular to the medium surface. Perpendicular recording media allow for a higher storage density than can be achieved in longitudinal recording media.

Computing device 12 may comprise a central processing unit (CPU) for any of a variety of computer devices, including, for example, a PC, a Macintosh computer, a computer workstation, a hand-held data terminal, a personal digital assistant (PDA), a mobile phone, a digital television, a laptop computer, a digital camera, a digital video or audio recording device, or the like. Controller 14 positions read head 16 relative to magnetic medium 15 based on instructions received from computing device 12. Controller 14 may also control the movement of magnetic medium 15 to precisely position read head 16 adjacent magnetic medium 15. In some cases, magnetic medium 15 may be stored on a spool (not shown) and controller 14 may unspool magnetic medium 15 to read data from magnetic medium 15 with read head 16.

Read head 16 comprises a perpendicular read head capable of detecting data from the magnetic domains oriented perpendicular to the surface of perpendicular magnetic medium 15. After recovering the data from magnetic medium 15, read head 16 forwards the data to encoding module 17. Encoding module 17 may create codewords by encoding the recovered data words with one or more parity bits. The codewords are then transmitted in sequences of data samples through a read channel 18 to a signal processor 20.

Read channel 18 may be represented by a discrete-time channel model. The transition response h(t) in perpendicular magnetic recording system 10 may be characterized by the hyperbolic tangent function. In that case, the transition response may be written as $h(t)=\tanh(\alpha t)$ with $\alpha=2/(0.5795\pi \ast pw_{50})$, where $pw_{50}$ is the time interval over which the amplitude of h(t) changes from the negative one-half to the positive one-half of the peak. Although h(t) does not have a finite energy, the energy of the first derivative of the transition response, $E_{dt}$, can be expressed in a closed form and allows a convenient way to normalize the noise power spectral density.

$$E_{dt} \equiv \int_{-\infty}^{\infty} [h'(t)]^2 dt = \alpha^2 \int_{-\infty}^{\infty} [\mathrm{sech}(\alpha t)]^4 dt = \frac{4}{3}\alpha. \quad (1)$$

When $E_{dt}=1$, $h(t)=\tanh\left(\frac{3}{4}t\right)$, where $\alpha \equiv 2/(0.5795\pi * pw_{50}) = 3/4$. Since the channel density $D_s$ is defined as the ratio of $pw_{50}$ to bit period T, the bit period T is given by $$T \equiv \frac{pw_{50}}{D_s} = \frac{1}{D_s} * \frac{8}{3*0.5795\pi}. \quad (2)$$

Figure 2:
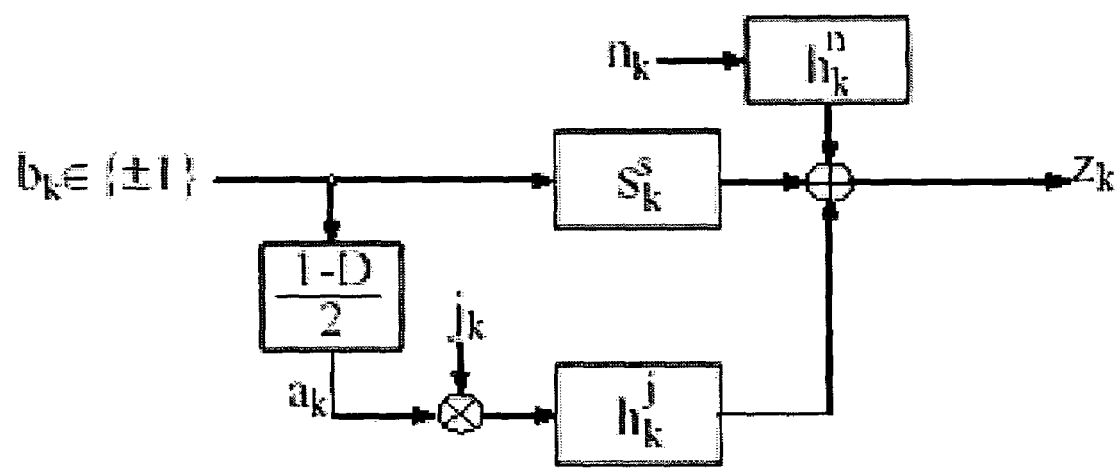
FIG. 2 is a block diagram of a discrete time channel model for a read channel in the system of FIG. 1.

From the continuous-time channel response, the equivalent discrete-time channel model can be derived, as shown in FIG. 2. In FIG. 2, the sequence $b_k$ represents the Non-Return to Zero (NRZ) binary data, $\alpha_k$ is the corresponding transition sequence, and $n_k$ is the additive white Gaussian noise (AWGN) sequence. An independent Gaussian random variable $j_k$ is applied to model the position jitter for the medium noise. The sequence $z_k$ represents the filter noisy readback sample sequences.

NRZ binary data may be applied to a discrete-time channel $s_k^s$. The discrete-time channel $s_k^s$ is computed as the sample of the combined response of the dibit response s(t) and p(t):

$$s_k^s = [s(t)*p(t)]_{t=kT} \quad (3)$$

where the dibit response $$s(t) \equiv \frac{1}{2}[h(t) - h(t-T)]$$

and the front-end band-limiting filter p(t) can be h (−t), which matches to the transition response h(t), or some low-pass filter.

The discrete-time channel model also includes an additive white Gaussian noise (AWGN) sequence, $n_k$, and an independent Gaussian random position jitter variable, $j_k$, to model the noise of magnetic medium 15. The transition response of the position jitter corresponds to $h_k^j = [h'(t)*p(t)]_{t=kT}$ and the transition response of the AWGN corresponds to $h_k^n * h_{-k}^n = [p(t) * p(-t)]_{t=kT}$ from which $h_k^n$ can be obtained via standard spectral factorization. The data sequence output of the discrete-time channel model represents filtered noisy sample sequences recovered from magnetic media 15 and transmitted through read channel 18.

The signal-to-noise ratio (SNR) for a longitudinal magnetic recording system can be defined as the ratio of the energy of the transition response, $E_t$, to the spectral height of the mixed noise, $N_\alpha$ which consists of the spectral height of the electronics noise $N_o$ and the average energy of the position jitter noise $M_j$. However, unlike the longitudinal recording channels, the energy of the transition response in perpendicular magnetic recording systems is infinite. One possible way of handling this issue is to utilize the energy of the first derivative of the transition response, $E_{dt}$, which is well-defined. Consequently, the SNR may be defined for perpendicular magnetic recording system 10 including noise from magnetic medium 15 as:

$$SNR \equiv \frac{E_{dt}}{N_\alpha} = \frac{1}{N_o + M_j}. \quad (4)$$

As described above, the noise variances of the AWGN and the noise of magnetic medium 15 are obtained under the assumption that $E_{dt}=1$. Note that the expressions for $h_k^j$ and $h_k^n$ depend on the channel density $D_s$ in such a way that the noise variances at the output of $h_k^j$ and $h_k^n$ increase with $D_s$.

Signal processor 20 detects a codeword from the sequence of data samples transmitted via read channel 18. Signal processor 20 makes use of a set of dominant error events 22 for perpendicular magnetic recording system 10. Dominant error events 22 may be used to create an error detection code that detects prescribed error events in the codewords. In some cases, the error detection code may comprise a parity check code. The parity check code may comprise a parity check matrix in which each row of the matrix is a parity check sum pattern that corresponds to one of dominant error events 22. In some cases, the number of parity bits added to the recovered data word by encoding module 17 corresponds to the number of parity check sum patterns included in the parity check code.

In the case of perpendicular magnetic recording system 10, distance analyses and simulation reveal that dominant error events 22 may take the form ±{+−} and ±{+−0+−} at medium to high linear densities, and ±{+−0 0+−} at very high linear densities. The above nomenclature refers to an erroneous change in bit value, from the original values to the detected values. For example, 35 {+−} indicates an erroneous change in two bits, ±{+−0+−} indicates erroneous changes in two bit values, followed by a correct bit, and then followed by erroneous changes in two bit values, and ±{+−0 0+−} indicates erroneous changes in two bit values, followed by two correct bits, and then followed by erroneous changes in two bit values.

Signal processor 20 may also include a correction module (not shown) to correct the detected error events. For example, signal processor 20 may include correlation filters that correspond to dominant error events 22. A type and a location of an error event detected in a codeword may be determined by selecting a maximum value from the output of the correlation filters, as will be described in greater detail below. The correction module may correct the codeword based on the type of the detected error event and the location of the detected error event in the codeword. Signal processor 20 provides the data word encoded in the corrected codeword to computing device 12.

Signal processor 20 may implement the error detection and correction method based on instructions stored on a computer-readable medium. Signal processor 20 may comprise one or more microprocessors, digital signal processors (DSPs), application-specific integrated circuits (ASICs), field-programmable gate arrays (FPGAs), or other equivalent logic circuitry. The computer-readable medium may include any magnetic or optical media, or electronic media, such as random access memory (RAM), read-only memory (ROM), electronically-erasable programmable ROM (EEPROM), flash memory, or the like, or a combination thereof Dominant error events 22 may be determined based on an effective distance analysis. The BER performance of a partial response maximum likelihood (PRML) system can be characterized by the effective distances of error events that take into account the shape of the target response, as well as the noise correlation at the output of an equalizer. The effective distance of a PRML system can be written as $$d_{eff}^2 = \frac{\left[\sum_i e_{yi}^2\right]^2}{\sum_{i,j} e_{yi} * \rho_{i-j} * e_{yi}} \quad (5)$$

where $e_{yi}$ is the output error event, which is the convolution of the particular input error event and the target response, and $\rho_{i-j}$ is the correlation coefficient of the correlated noise at the equalizer output.

The effective distance depends partly on the selection of the target response, which depends on different mixed noise environments and channel densities. The target responses are chosen as they are found to provide relatively large effective distances compared to other target responses. For example, the target [1, 6, 7, 2] may be considered the best target response at densities around $D_s=1.4$. The ratio of AWGN to magnetic medium noise is 50:50, with the magnetic medium noise containing only jitter noise. It is observed that while the target [1, 6, 7, 2] provides larger minimum effective distances up to density 1.6, the target [1, 2, 2, 1] carries a larger minimum effective distance from channel density 1.6 to 2.6. As the minimum effective distance becomes larger, the BER performance becomes lower. Consequently, the target response [1, 2, 2, 1] is considered reliable at densities higher than Ds=1.6. Although the choice of the target response typically depends on the specific noise environment and the range of densities of interest, the description set forth below will mainly be concerned with the target [1, 2, 2, 1] for purposes of illustration.

The effective distances of various error events for the target [1, 2, 2, 1] may be compared. The error event ±[2, −2] yields the minimum effective distance at all densities. The error events ±[2, −2, 0, 2, −2] and ±[2, −2, 0, 2, −2, 0, 2, −2] are also associated with small effective distances at most densities. Although the error event ±[2, −2, 0, 0, 2, −2] has relatively large effective distances at densities lower than 2.0, it yields smaller effective distances beyond this density. Furthermore, the error event ±[2, −2, 0, 0, 2, −2, 0, 0, 2, −2] has small effective distances at only very high densities such as 2.6. Based on this effective distance analysis, it may be concluded that the error events ±[2, −2], ±[2, −2, 0, 2, −2], and ±[2, −2, 0, 2, −2, 0, 2, −2] occur more frequently than any other error events up to density 2.0, and then the additional error event ±[2, −2, 0, 0, 2, −2] also occurs often at higher channel densities.

Given that the dominant error events are ±{+−}, ±{+−0+−}, {+−0+−0+−}, and {+−0 0+−} (relying on the short-hand notation defined above), an error detection code may be specifically formulated to detect these error events. The targeted error detection coding method described herein does not distinguish + errors and − errors in an error event, but simply uses 1 to represent an erroneous bit in the error event and 0 a correct bit. Accordingly, dominant error events 22 may be denoted by {1 1}, {1 1 0 1 1}, {1 1 0 1 1 0 1 1}, and {1 1 0 0 1 1}.

Figure 3:
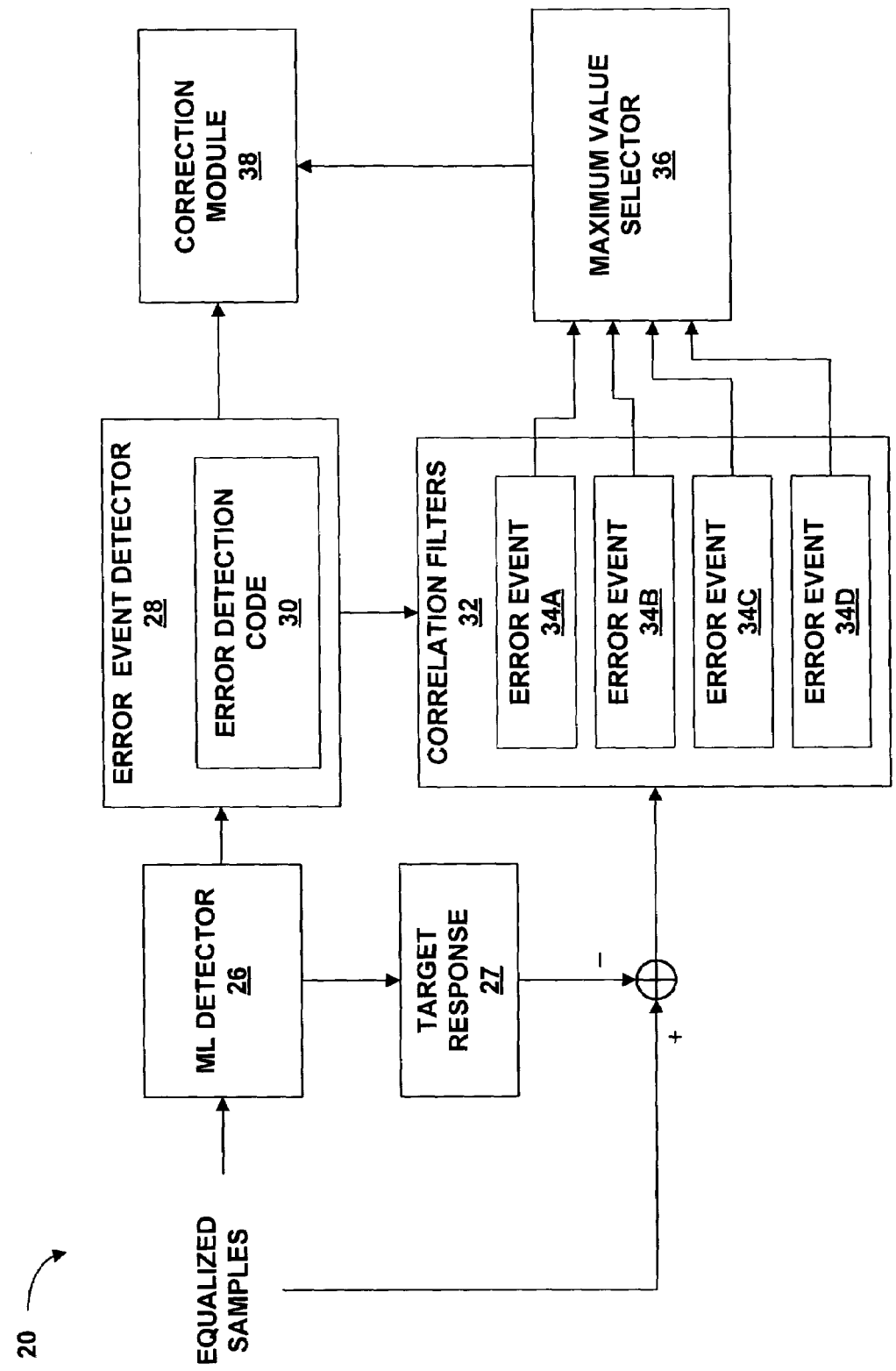
FIG. 3 is a block diagram illustrating a signal processor in the magnetic recording system of FIG. 1 in greater detail.

FIG. 3 is a block diagram illustrating signal processor 20 from FIG. 1 in greater detail. Signal processor 20 receives sequences of equalized data samples via read channel 18. The sequences of equalized data samples include data words recovered from magnetic medium 15 by read head 16 and then encoded by encoding module 17. The transmitted data samples may be equalized at the output of read channel 18 to mitigate the effects of intersymbol interference (ISI).

Signal processor 20 includes a maximum likelihood (ML) detector 26 that detects a codeword from a received sequence of equalized samples. In some cases, ML detector 26 may comprise a Viterbi detector. ML detector 26 compares the received sequence of equalized samples with a known set of sequences given by the equalization target constraints. As described above, the equalized samples include noise from magnetic medium 15, e.g., position jitter, and AWGN from read channel 18. ML detector 26 compares the noisy samples with valid sample sequences to determine the most likely codeword.

ML detector 26 then provides the detected codeword to an error event detector 28. Error event detector 28 includes an error detection code 30 that detects prescribed error events in the codeword. Error detection code 30 may detect the error events by moving through the codeword in a block-by-block process, as opposed to a sliding window process. The set of dominant error events 22 determined for perpendicular magnetic recording system 10 may be used to create error detection code 30. In some cases, error detection code 30 may comprise a parity check code. As described herein, error detection code 30 comprises a parity check matrix in which each row of the matrix is a parity check sum pattern that corresponds to one of dominant error events 22 (FIG. 1).

In the case of perpendicular magnetic recording system 10, error detection code 30 may be designed to first detect the error event {1 1}. It is clear that a periodic parity check sum pattern [1 0 1 0 1 0 . . . 1 0] or [0 1 0 1 0 1 . . . 0 1] will be able to detect any single occurrence of the error event {1 1} within the codeword. Assuming even parity, the corresponding parity check equation is $c1 \oplus c3 \oplus c5 \oplus c7 \oplus \ldots = 0$ or $c2 \oplus c4 \oplus c6 \oplus c8 \oplus \ldots = 0$ where $c_i$ is the $i^{th}$ bit in the codeword.

The second error event that error detection code 30 may be designed to detect is the error event {1 1 0 1 1}. It is easy to see that a repetitive parity check sum pattern of 1's separated by 4 0's, e.g., [1 0 0 0 0 1 0 0 0 0], will be able to detect a single occurrence of the error event {1 1 1 1 1} within the codeword. However, for the 5-bit error event of interest {1 1 0 1 1}, the same parity check sum pattern fails to detect the error event when the zero is aligned with a 1 in the parity check sum pattern. This undetected error event can be handled by introducing a third parity check sum pattern that is a shifted version of the previous parity check sum pattern. As an example, a 3-bit shifted pattern [0 0 0 1 0 0 0 0 1 0], or any shift, would be effective in detecting the error event {1 1 0 1 1}.

For a given codeword length, the targeted error events that reside only partially within the current codeword (i.e., occur at the codeword boundary) should also be detected. In order to ensure detection at the codeword boundary, the amount of shift for each parity check sum pattern may need to be adjusted. Assume a codeword length of 12 bits, which will be the case if encoding module 17 (FIG. 1) encodes each 9-bit long runlength-limited (RLL) data word recovered from magnetic medium 15 with three parity bits. The parity check matrix given by $$H = \begin{bmatrix} 1 & 0 & 1 & 0 & 1 & 0 & 1 & 0 & 1 & 0 & 1 & 0 \\ 0 & 1 & 0 & 0 & 0 & 0 & 1 & 0 & 0 & 0 & 0 & 1 \\ 1 & 0 & 0 & 0 & 0 & 1 & 0 & 0 & 0 & 0 & 1 & 0 \end{bmatrix} \quad (6)$$

detects any single error event of the type {1 1} or {1 1 0 1 1} within a codeword as well as at either boundary. The parity check matrix of equation (6) represents a (12, 9) block code with a code rate of 9/12.

Let $[h_j(D)]_n$ denote a monic polynomial that represents a repetitive binary pattern of 1's separated by j 0's, with the overall length truncated to n. Also, let $[D^s h_j(D)]_n$, $0 \leq s \leq j$, represent the similar bit pattern of the same length but shifted to the right by s positions to allow s consecutive 0's at the start. A class of parity check matrices can then be represented by a polynomial vector: $H(D)=[[D^{s_1}h_1(D)]_n, [D^{s_2}h_4(D)]_n, [D^{s_3}h_4(D)]_n]^T$, $s_2 \neq s_3$. For example, the parity check matrix of (6) corresponds to the shifts $s_1=0$, $s_2=1$, and $s_3=0$. Other choices of shifts are possible that ensure error event detection at the boundaries, e.g., $s_1=0$, $s_2=0$, and $s_3=1$.

In some cases, a set of shifts does not exist that result in three independent weight-1 columns at the end of the parity check matrix without compromising error detection capability at the codeword boundaries. Therefore, in general, the parity check matrix cannot be rearranged via linear combination and permutation of the rows in a form that involves the identity submatrix at the end. In other words, the parity check matrix cannot always achieve echelon canonical form.

However, any three independent weight-1 columns can specify parity bits in a systematic form. The position of a chosen column specifies the parity bit position in the codeword and the row position of the 1 in that column identifies the corresponding parity check sum pattern. For example, columns 2, 3, and 6 in the parity check matrix of equation (6) can identify the parity bit positions for the second, first, and third parity check sum patterns, respectively. Accordingly, the codeword can be written in vector form as $$[c_1 \ c_2 \ c_3 \ c_4 \ c_5 \ c_6 \ c_7 \ c_8 \ c_9 \ c_{10} \ c_{11} \ c_{12}]^T \quad (7)$$
$$= [x_1 \ p_2 \ p_1 \ x_2 \ x_3 \ p_3 \ x_4 \ x_5 \ x_6 \ x_7 \ x_8 \ x_9]^T$$

where $x_i$'s are data bits and $p_i$ is the parity bit for the $i^{th}$ check pattern with $p_2 = c_7 \oplus c_{12}$, $p_1 = c_1 \oplus c_5 \oplus c_7 \oplus c_9 \oplus c_{11}$, and $p_3 = c_1 \oplus c_{11}$, assuming even parity constraints.

The parity check matrix is a linear code as a sum of any two codewords that can be shown to be a valid codeword. The parity check matrix is also clearly systematic, although it is not in echelon canonical form that allows the parity bits to be appended at either end. The presence of all zero-columns in the parity check matrix of equation (6) indicates that weight-1 codewords c exist for which Hc=0. This, in turn, means that the minimum distance of this parity check matrix is d=1. It should be noted that in general, a d=1 linear error detection code cannot detect multi-bit error events, let alone single bit errors. It is the a priori knowledge of the specific dominant error events that allows the detection of such error events.

With the codeword length at n bits, the rate of the code becomes (n−3)/n. A parity check matrix similar to that given in equation (6) can be found for any length n by properly choosing the set $\{s_1, s_2, s_3\}$. As an example, it can be seen that the parity check polynomial vector given by $H(D)=[[h_1(D)]_n, [Dh_4(D)]_n, [h_4(D)]_n]^T$ can check all error events {1 1} and {1 1 0 1 1} within and at the boundaries for all n, except n=10m+4, 10m+8, or 10m, with m denoting a positive integer. At these values of n, the last column of the parity check matrix ends with an all-zero column. This can easily be seen by observing that the $4^{th}$, $8^{th}$, and $10^{th}$ columns of the parity check matrix in equation (6) are all-zero columns, and noting that the parity check sum patterns in each row are periodic with a 10-bit period. An all-zero column at the end of a parity check matrix means that the error event {1 1} or {1 1 0 1 1} that overlaps with the current codeword only in one position is not detectable within the current codeword. To prevent this, a slightly different matrix $H(D)=[[Dh_1(D)]_n, [Dh_4(D)]_n, [h_4(D)]_n]^T$ can be chosen instead for these particular values of n.

If odd-parity checks are used and the parity bits are chosen to be spread out as much as possible within the codeword, then a maximum runlength constraint (K-constraint) is automatically satisfied, although the resulting K value may be unacceptably large, depending on the codeword length chosen.

In many cases, it is also possible to force the echelon canonical form by adding parity bits at the end of the recovered data word. Let us consider possible ways of appending three parity bits to a 10-bit data word. The challenge is to ensure that the occurrences of errors at all positions including those of the parity bits are covered by the checks. Consider the following parity check matrix $$H = \begin{bmatrix} 1 & 0 & 1 & 0 & 1 & 0 & 1 & 0 & 1 & 0 & | & 1 & 0 & 0 \\ 0 & 1 & 0 & 0 & 0 & 0 & 1 & 0 & 0 & 0 & | & 0 & 1 & 0 \\ 0 & 0 & 0 & 0 & 1 & 0 & 0 & 0 & 0 & 1 & | & 0 & 0 & 1 \end{bmatrix}. \quad (8)$$

The appended identity matrix breaks the regularity of the first and third parity check sum patterns. As a result, the first parity check sum pattern is incapable of detecting the error event {1 1} aligned at the end of the codeword. Also, the second and third parity check sum patterns fail to detect the {1 1 0 1} event aligned to the right (i.e., the {1 1 0 1 1} event whose last position is out of the codeword boundary). However, the first event is detected by both the second and third parity check sum patterns, and the second event is detected by the first parity check sum pattern. Inspection of error events {1 1} and {1 1 0 1 1} as they slide through the codeword boundary reveals that the parity check matrix given in equation (8) can detect all such error events that only partially exist within the current codeword. The corresponding codeword structure is given by:

$$[x_1 x_2 x_3 x_4 x_5 x_6 x_7 x_8 x_9 x_{10} | p_1 p_2 p_3]^T$$

The left-side, non-identity portion of the parity check matrix in equation (8) can simply be concatenated m times to form (10 m+3, 10m) codes for any positive integer m.

Other variations are possible that append only some of the parity bits, allowing the remaining parity bits to be embedded within the codeword as in the parity check matrix of equation (6). It is also possible to allow the appended parity columns to have weights of more than 1. As an example, consider a parity check matrix given by:

$$H = \begin{bmatrix} 1 & 0 & 1 & 0 & 1 & 0 & 1 & 0 & 1 & 0 & | & 1 & 0 & 1 \\ 0 & 1 & 0 & 0 & 0 & 0 & 1 & 0 & 0 & 0 & | & 0 & 1 & 0 \\ 0 & 0 & 1 & 0 & 0 & 0 & 0 & 1 & 0 & 0 & | & 0 & 0 & 1 \end{bmatrix}. \quad (9)$$

In this case, the parity check matrix of (9) corresponds to:

$$H(D)=[[h_1(D)]_{13}, [Dh_4(D)]_{13}, [D^2 h_4(D)]_{13}]^T$$

and the last three columns correspond to parity bits. In this case, the second and third parity bits are functions only of the data bits, but the first parity check sum pattern now involves two parity bits $p_1$ and $p_3$. This poses no difficulty in encoding and decoding as long as the parity bits are handled in a certain order (i.e., $p_2$ and $p_3$ first and then $p_1$). Numerous other parity bit arrangement variations are possible. However, if the parity check sum patterns have to be broken in the parity bit zone, the error detection capability should remain intact over all bits including the parity bits.

The third error event that error detection code 30 may be designed to detect is the error event {1 1 0 1 1 0 1 1}. However, one of the parity check sum patterns given above can detect this error event depending on its position. As the density increases, error detection code 30 may be designed to detect the error event {1 1 0 0 1 1}. This error event cannot be detected by the three parity check sum patterns discussed above. Extending the idea used to detect the {1 1 0 1 1} error event, it can be seen that the parity check sum pattern of [1 0 0 0 0 0 1 0 0 0 0 0 1 0 . . . ] and its appropriate shift can detect the {1 1 0 0 1 1} error event anywhere within as well as at the boundaries of the codeword. These latest two check patterns are periodic with period of 6-bits. Therefore, the smallest common period for all five parity check sum patterns discussed above is equal to 30-bits. The following is a parity check matrix that incorporates all five checks:

$$H = \begin{bmatrix} 1010101010101010101010101010 \\ 100001000010000100001000010 \\ 000100001000010000100001000010 \\ 1000001000001000001000001000001 \\ 00010000010000010000010000100 \end{bmatrix} \quad (10)$$

Note that other choices of shifts for the rows of the parity check matrix of equation (10) are possible without compromising the error detection capability. This is true as long as the relative shifts between rows 2 and 3 and between rows 4 and 5 guarantee the detection of the {1 1 0 1 1} and {1 1 0 0 1 1} error events, respectively. Again, the parity bit positions can be determined by inspecting the weight-1 columns. It can be shown in this example that there are a total of 13 weight-1 columns. Of these, columns 3, 5, 15, 17, 23, and 27 have the weight on row 1, columns 6 and 26 have weight on row 2, columns 14 and 24 have weight on row 3, and columns 10, 22, and 28 have weight on row 5. There is no weight-1 column with the weight on row 4. Therefore, the resulting parity check is not systematic, although it detects all five dominant error events and their shifts within as well as at the codeword boundaries. The following parity check matrix has at least one set of five weight-1 independent columns and results in a systematic parity check matrix:

$$H = \begin{bmatrix} 1010101010101010101010101010 \\ 01000010000100001000010000100 \\ 000010000100001000010000100001 \\ 0100000100001000010000010000 \\ 00010000010000010000010000100 \end{bmatrix} \quad (11)$$

Again, in some cases, the echelon canonical form can be forced without compromising the error detection capability. Consider, for example, a (35, 30) code, shown in equation (12), wherein the first, third, fourth and fifth check patterns are broken in the parity bit zone.

$$H = \left[ \begin{array}{c|c} 1010101010101010101010101010 & 10000 \\ 01000010000100001000010000100 & 01000 \\ 000010000100001000010000100001 & 00100 \\ 0100000100001000010000010000 & 00010 \\ 00010000010000010000010000100 & 00001 \end{array} \right] \quad (12)$$

However, it can be seen that all three dominant error event patterns are covered by at least one check as they slide through the parity zone. Since the left side of the parity check matrix in equation (12) represents one full common period of all five parity check sum patterns, the parity check matrix provides a basis for (30m+5, 30m) codes.

As another example of forced canonical form, a parity check matrix for a (45, 40) code is considered in equation (13).

$$H = \left[ \begin{array}{c|c} 101010101010101010101010101010101010 & 10000 \\ 0100001000010000100001000010000100 & 01000 \\ 001000010000100001000010000100001 & 00100 \\ 0001000010000100001000010000001 & 00010 \\ 00000100001000010000010000010000 & 00001 \end{array} \right] \quad (13)$$

The parity check sum patterns 1, 4, and 5 are broken in the parity bit zone. By inspection, however, it can be seen that all three types of dominant error event patterns are still detected within the codeword and at the boundaries. In general, for a given codeword length n, there exists a high probability that a polynomial vector of the form:

$$H(D)=[[D^{s1}h_1(D)]_n,[D^{s2}h_4(D)]_n,[D^{s3}h_4(D)]_n,[D^{s4}h_5(D)]_n,[D^{s5}h_5(D)]_n]^T,$$

which can serve as a basis for a parity check matrix that can detect all of the prescribed error events, whether in echelon canonical form or not.

Similar error-event specific parity check coding can be applied based on the Non-Return to Zero Inverted (NRZI) convention after converting the dominant error events according to the NRZI convention. The dominant error events {1 1}, {1 1 0 1 1}, and {1 1 0 0 1 1} in the NRZ sequence, for example, can be shown to be equivalent to the error events {1 0 1}, {1 0 1 1 0 1}, and {1 0 1 1 1 0 1} in the NRZI sequence, respectively. Again either the + or − bit error is denoted in the error event by 1 and no bit error is denoted in the error event by 0, irrespective of NRZ or NRZI. A parity check matrix can be formed based on these translated error events, but the number of parity bits required to detect the equivalent set of error events would not be reduced from the error detection code design based on the NRZ convention. In general, the parity check polynomial vector of the form $H(D)=[[D^{s1}h_{j_1}(D)]_n,[D^{s2}h_{j_2}(D)]_n,[D^{s3}h_{j_3}(D)]_n, \ldots ,[D^{sr}h_{j_r}(D)]_n]^T$, $0 \leq s_l \leq j_l$, where $l=1, \ldots, r$, provides a basis for error detection codes geared to prescribed error events.

As described above, error detection code 30 can detect any dominant error events that occur in perpendicular magnetic recording system 10. The performance of perpendicular magnetic recording system 10 may be improved by employing error correction processing that corrects the dominant error events detected at the output of ML detector 26. In the case where ML detector 26 comprises a Viterbi detector, the error correction processing comprises post-Viterbi error correction processing.

Signal processor 20 includes correlation filters 32 that correspond to dominant error events 22. For example, error event filter 34A may correspond to the error event {1 1}, error event filter 34B may correspond to the error event {1 1 0 1 1}, error event filter 34C may correspond to the error event {1 1 0 1 1 0 1 1}, and error event filter 34D may correspond to the error event {1 1 0 0 1 1}. Correlation filters 32 receive notice when error event detector 28 detects an error event in the output of ML detector 26. Correlation filters 32 also receive the equalized samples transmitted via read channel 18 minus the target response 27 T(D) of the detected codeword. The channel response of each error event filter 34A-34D is a dominant error event, which has been considered and convolved with the reversed target response $T(D^{-1})$.

Correlation filters 32 provide the output of each error event filter 34A-34D to a maximum value selector 36. A type and a location of the error event detected in the codeword may be determined by selecting a maximum value from the output of correlation filters 32. The type and location of the maximum value error event in the detected codeword is then supplied to a correction module 38. Correction module 38 also receives the detected codeword from error event detector 28. Correction module 38 corrects the detected codeword based on the type of the detected error event and the location of the detected error event in the codeword. Signal processor 20 may then provide the corrected data word encoded in the detected codeword to computing device 12.

Figure 4:
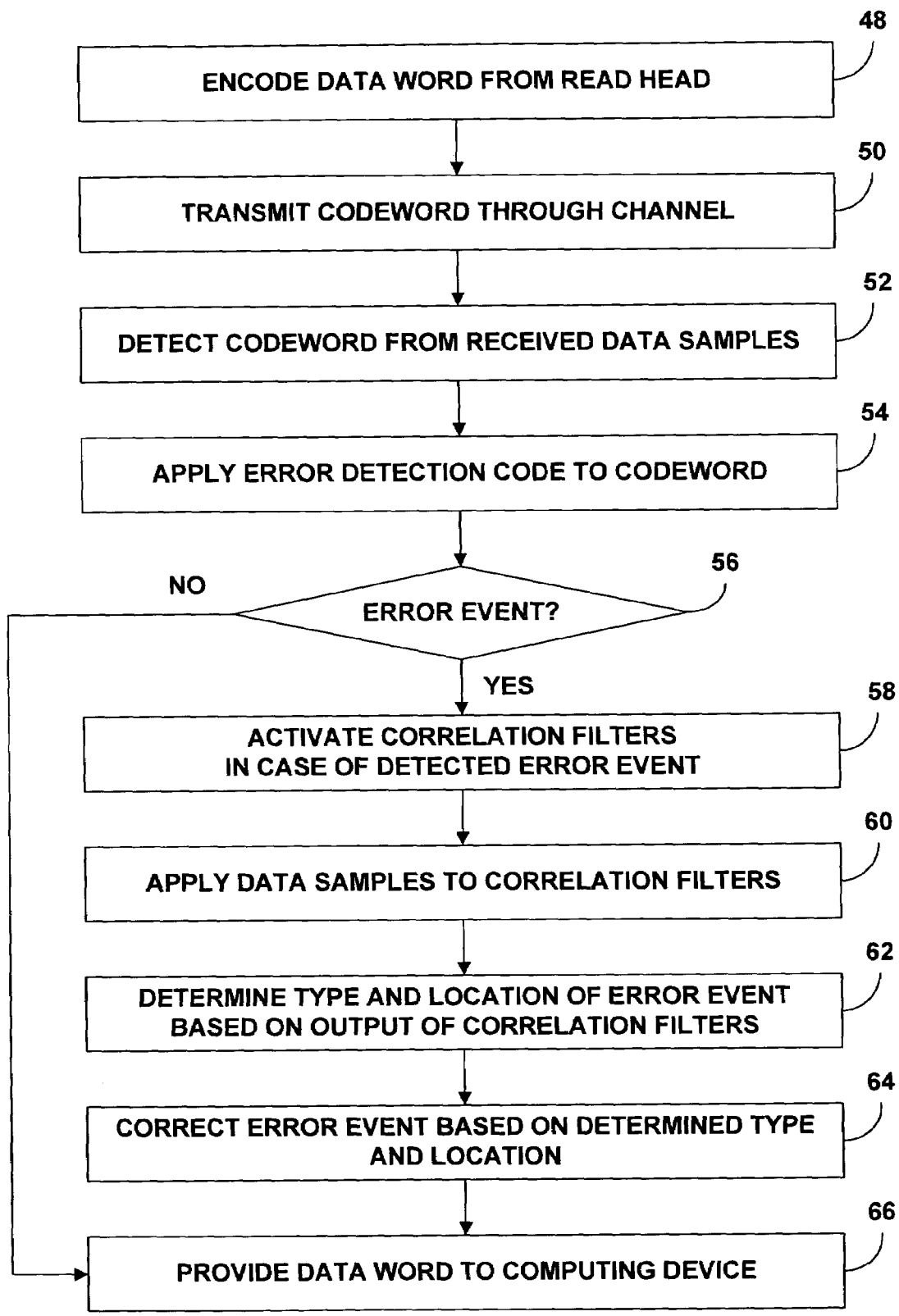
FIG. 4 is a flow diagram illustrating a method of detecting and correcting an error event in a codeword.

FIG. 4 is a flow chart illustrating a method of detecting and correcting an error event in a codeword. The method will be described as referring to perpendicular magnetic recording system 10 from FIGS. 1 and 3.

Computing device 12 instructs controller 14 of recording system 10 to position read head 16 adjacent magnetic medium 15. As described above, in this example, magnetic medium 15 comprises perpendicular magnetic tape. Once positioned adjacent magnetic medium 15, read head 16 detects data from the magnetic domains oriented perpendicular to the surface of perpendicular magnetic medium 15. After recovering the data from magnetic medium 15, read head 16 forwards the data to encoding module 17. Encoding module 17 may create a codeword by encoding a recovered data word with one or more parity bits (48). The codeword is then transmitted in a sequence of data samples through a read channel 18 to a signal processor 20 (50).

Signal processor 20 receives the sequence of data samples via read channel 18. Signal processor 20 includes ML detector 26 that detects a codeword from the received sequence of data samples (52). ML detector 26 compares the noisy samples with valid sample sequences to determine the most likely codeword. ML detector 26 then provides the detected codeword to error event detector 28, which includes error detection code 30 for detection of prescribed error events in the codeword. Error event detector 28 applies error detection code 30 to the detected codeword, e.g., in a block-by-block process (54). The set of dominant error events 22 determined for perpendicular magnetic recording system 10 may be used to create error detection code 30. In some cases, error detection code 30 may comprise a parity check code. Error detection code 30 may comprise a parity check matrix in which each row of the matrix is a parity check sum pattern that corresponds to one of dominant error events 22.

If error event detector 28 does not detect an error event in the detected codeword (no branch of 56), the detected codeword does not need to be corrected and signal processor 20 may provide the data word encoded in the codeword to computing device 12 (66). If error event detector 28 does detect an error event in the detected codeword (yes branch of 56), signal processor 20 corrects the codeword with the error correction processing.

Signal processor 20 includes correlation filters 32 with error event filters 34A-34D corresponding to each of dominant error events 22. Error event detector 28 activates correlation filters 32 in the case of a detected error event (58). Correlation filters 32 also receive the data samples transmitted via read channel 18 minus the target response 27 T(D) of the detected codeword (60). Correlation filters 32 provide the output of each error event filter 34A-34D to maximum value selector 36. Maximum value selector 36 determines a type and a location of the error event detected in the codeword by selecting a maximum value from the output of correlation filters 32 (62).

The type and the location of the maximum value error event in the detected codeword is then supplied to correction module 38. Correction module 38 also receives the detected codeword from error event detector 28. Correction module 38 corrects the detected codeword based on the type of the detected error event and the location of the detected error event in the codeword (64). Signal processor 20 may then provide the corrected data word encoded in the detected codeword to computing device 12 (66).

Figure 5:
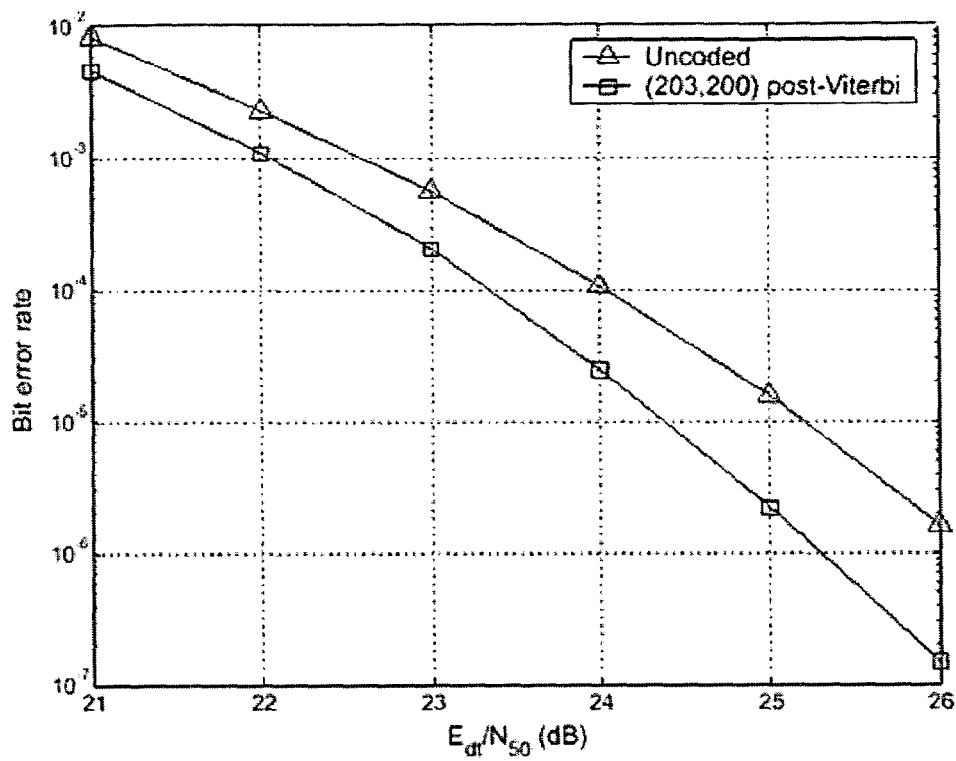
FIGS. 5 and 6 are plots illustrating bit error rate (BER) performance of error detection coding techniques as described in this disclosure.
Figure 6:
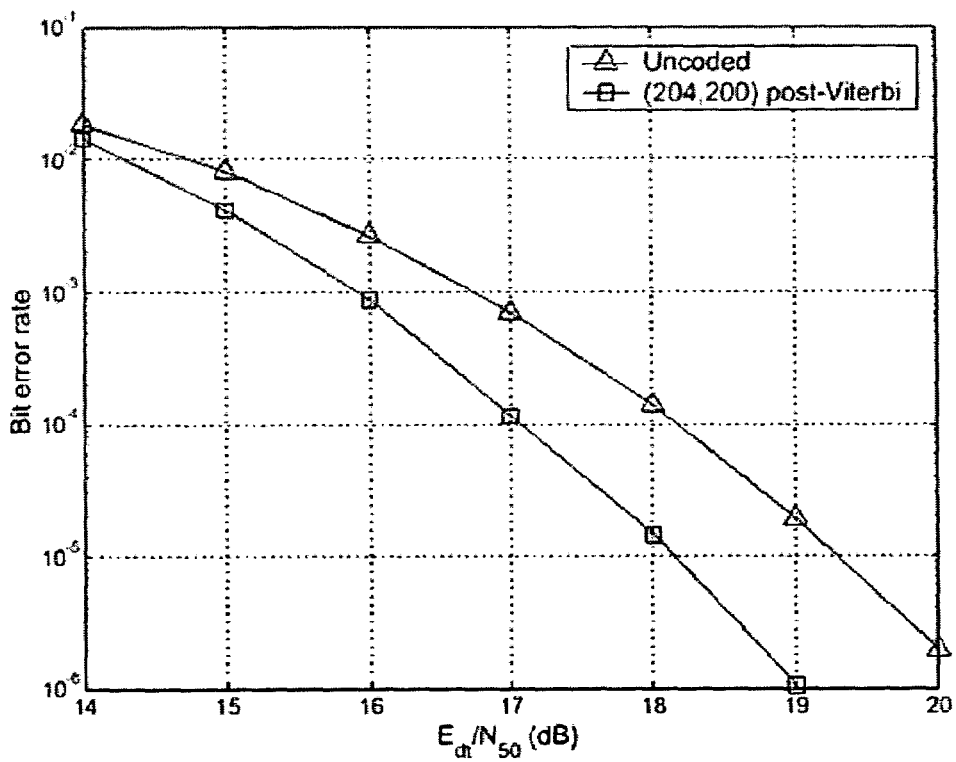

FIGS. 5 and 6 are plots illustrating bit error rate (BER) performance of error detection coding as described herein. The parity check matrix designed above uses at most five parity check bits to detect dominant error events within a codeword and at codeword boundaries at any reasonable densities. Choosing m=5 in the (40m+3, 40m) code of equation (8), a (203, 200) code is applied to the error correction processing in order to obtain the BER performance at user density 2.0. In this case, the user density $D_u$ is defined from the channel density $D_s$ as $$D_u = D_s * R \qquad (14)$$

where R is the code rate. For user density 2.0, the corresponding channel density becomes 2.03 with a (203, 200) code.

FIG. 5 compares the BER performances of the (203, 200) parity-based post-Viterbi error correction processing and the uncoded ML detector at user density $D_u=2.0$, for the target [1, 2, 2, 1]. Because the mixed noise consists of 50% AWGN and 50% magnetic medium noise, the noise spectral density in the SNR definition is expressed as $N_{50}$. The post-Viterbi error correction processing provides a considerable performance gain as the SNR increases, because the proposed error detection coding method detects all of the dominant error events and the error correction processing subsequently corrects most of the detected error events. As an example, a gain of 0.7 dB at BER=$10^{-4}$ and a gain of 0.82 dB gain at BER=$10^{-5}$ are observed.

FIG. 6 compares the BER performances of the (203, 200) parity-based post-Viterbi error correction processing and the uncoded ML detector at user density $D_u=1.4$. The dominant error events at this density and the target of [1, 6, 7, 2] are different and are given by ±{+−}, ±{+−+}, ±{+−+−}, ±{+−+−+}, ±{+−+−+−}, or ±{+−0+−}. As discussed above, the targeted error detection coding method described herein does not distinguish + errors and − errors in an error event, but simply uses 1 to represent an erroneous bit in the error event and 0 a correct bit. Accordingly, the dominant error events may be denoted by {1 1}, {1 1 1}, {1 1 1 1}, {1 1 1 1 1}, {1 1 1 1 1 1}, and {1 1 0 1 1}. These error events may be detected by adding an extra parity bit to the three parity bits used above for $D_u=2.0$. An example of a parity check matrix with four parity bits is given as:

$$H = \begin{bmatrix} 1 & 0 & 1 & 0 & 1 & 0 & 1 & 0 & 1 & 0 & | & 1 & 0 & 0 & 0 \\ 0 & 1 & 0 & 0 & 0 & 0 & 1 & 0 & 0 & 0 & | & 0 & 1 & 0 & 0 \\ 0 & 0 & 1 & 0 & 0 & 0 & 0 & 1 & 0 & 0 & | & 0 & 0 & 1 & 0 \\ 0 & 0 & 0 & 1 & 0 & 0 & 1 & 0 & 0 & 1 & | & 0 & 0 & 0 & 1 \end{bmatrix} \quad (15)$$

The 4$^{th}$ row of the parity check matrix in equation (15) is added in order to detect the dominant error event [1 1 1]. It can be observed that the dominant error event [1 1 1 1 1] can be detected by the parity check sum patterns in the 2$^{nd}$ and 3$^{rd}$ rows. Another error event [1 1 1 1] may also be detected by the 2$^{nd}$ and 3$^{rd}$ rows. The parity check matrix given in equation (15) and its expanded version (40m+4, 40m) are able to detect the dominant error events at lower densities such as 1.4. FIG. 6 shows that the use of the (204, 200) parity check code along with post-Viterbi error correction processing is able to produce a substantial performance gain. For example, a gain of 1.11 dB at BER=10$^{-4}$ and a gain of 1.16 dB at BER=10$^{-5}$.

Note that the simulations described herein do not consider runlength-limited coding in any systems, but the relative SNR gains should remain the same after considering the rate loss effect associated with a maximum runlength constraint typically imposed in practical systems.

Figure 7:
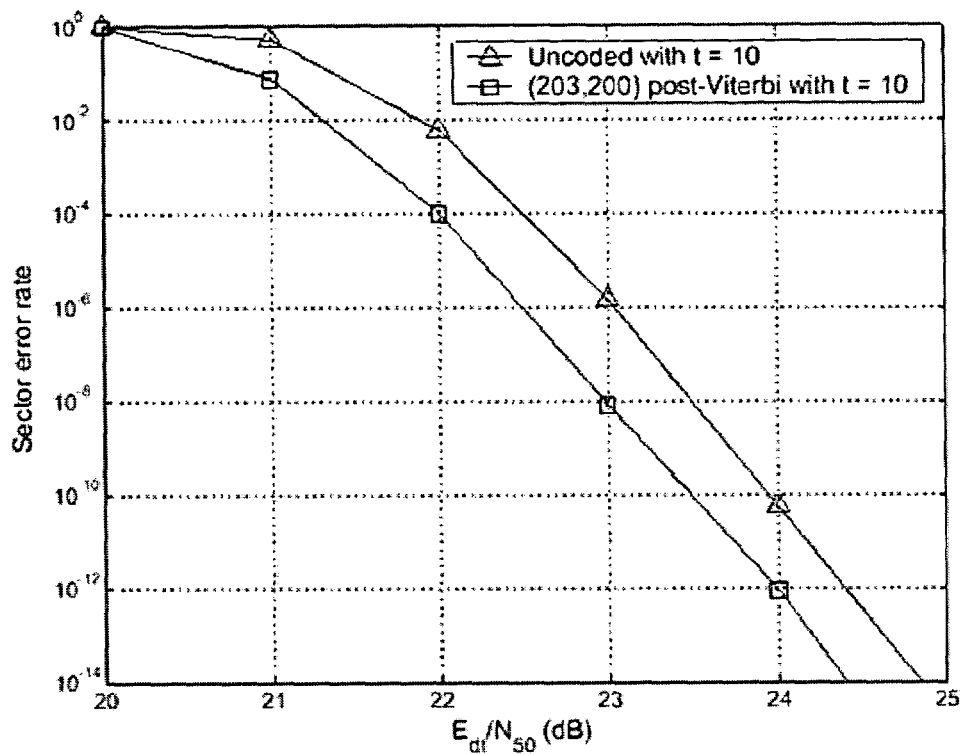
FIGS. 7 and 8 are plots illustrating sector error rate performance of error detection coding as described in this disclosure.
Figure 8:
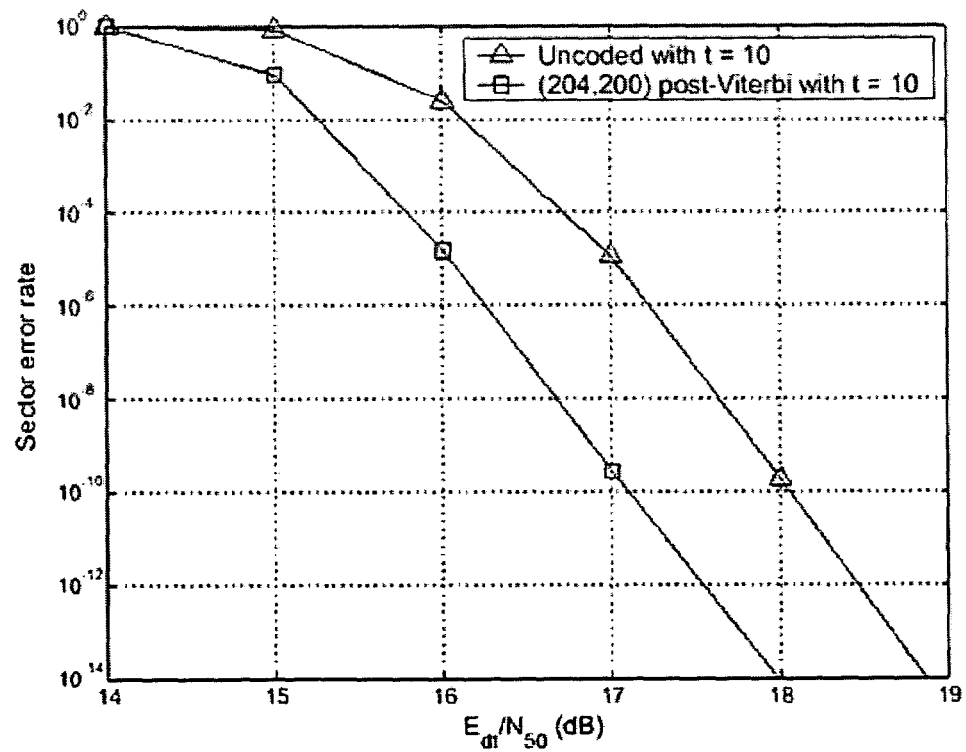

FIGS. 7 and 8 are plots illustrating sector error rate (SER) performance of error detection coding as described herein. An (n, k, t) Reed-Solomon (RS) code can correct up to t symbol errors in an n-symbol code block that includes k information symbols. Applying an outer RS code to the parity-based error correction processing, the SER, defined as the ratio of the number of uncorrectable sectors to the total number of transmitted sectors, may be computed. The computation can be done using the multinomial distribution for the probabilities of the symbol errors with different lengths.

For each length-i symbol error, where i=1, . . . , k, let $x_i$ and $p_i$, respectively, be the number and the probability of occurrence. The probability density function based on the multinomial distribution is then described by:

$$f_{x_1,\ldots,x_k}(x_1, \ldots, x_k) = \frac{n!}{x_1! x_2! \ldots x_{k+1}!} * p_1^{x_1} p_2^{x_2} \ldots p_{k+1}^{x_{k+1}}. \quad (16)$$

Here $x_{k+1}$ and $p_{k+1}$ denote the number and the probability of no erroneous symbols in a sector, and accordingly, $$\sum_{i=1}^{k+1} p_i = 1 \text{ and } \sum_{i=1}^{k+1} x_i = n.$$

To compute the SER for a 512-information-byte sector, a shortened RS code based on GF($2^{10}$) is used. Various numbers of correctable symbol errors are applied for comparison. The overall user density D'$_u$ taking into account the outer RS code is defined as D'$_u$=D$_u$*R, where R is the code rate of an outer RS code. Since an (n, k, t) shortened RS code can correct up to t symbol errors in a sector and does not require an interleaving, the probability of an uncorrectable sector, which is the SER, is simply given by $$P_{sector} = 1 - \sum_{x_1} \ldots \sum_{x_k} f_{x_1,\ldots,x_k}(x_1, \ldots, x_k) \quad (17)$$

where $\sum_{i=1}^{k} i * x_i \leq t$.

FIG. 7 compares the SERs of the uncoded ML detector and the three parity bit based post-Viterbi error correction processing with a (430, 410, 10) outer RS code. The overall user density D'$_u$=1.9070, which is obtained by the multiplication of the density D$_u$=2.0 by the RS code rate 410/430. The three parity bit based error correction processing attains the SER improvement, akin to the BER melioration. The gain is approximately 0.4 dB at SER=1.0×10$^{-12}$.

FIG. 8 shows a similar set of SER plots for a lower density D$_u$=1.4, based on the (204, 200) code and the RS code. It can be seen that the gain associated with the parity check code is considerable at this density. The SNR gain at SER=1.0×10$^{-12}$ is seen to be approximately 0.91 dB. In summary, the parity-based post-Viterbi error correction processing performs better than the uncoded ML detector with the same outer RS code at both representative user densities.

Various embodiments of the invention have been described. For example, an error detection code has been described that detects prescribed error events in a codeword. Error correction processing has also been described that corrects the detected error events. Significant performance gain has been achieved when the error correction processing is combined with the error detection code.

Nevertheless, various modifications may be made without departing from the scope of the invention. For example, although the error detection coding method is primarily described herein for a perpendicular magnetic recording system, the error detection coding method may also be applied to longitudinal magnetic recording systems, other types of recording system, or other communication systems having channels characterized by specific error events. These and other embodiments are within the scope of the following claims.

The invention claimed is:

1. A method comprising detecting an occurrence of an error event in a codeword with an error detection code that corresponds to one or more dominant error events prescribed for a communication system, wherein the error detection code uses a parity check matrix that includes a plurality of rows of periodic parity check sum patterns for detecting the error events, each of the periodic parity check sum patterns comprising a repetitive binary pattern with a length of n bits.

2. The method of claim 1, wherein detecting the occurrence of the error event comprises detecting the occurrence of the error event at least partially within the codeword.

3. The method of claim 1, wherein the error event is of the form ±{+−}, ±{+−0+−}, ±{+−0+−0+−}, or ±{+−0 0+−}, wherein ±{+−} indicates an erroneous change in two consecutive bit values, ±{+−0+−} indicates an erroneous change in two consecutive bit values, followed by a correct bit value, and then followed by an erroneous change in two consecutive bit values, ±{+−0+−0+−} indicates an erroneous change in two consecutive bit values, followed by a correct bit value, followed by an erroneous change in two consecutive bit values, followed by a correct bit value, followed by an erroneous change in two consecutive bit values, and ±{+−0 0+−} indicates an erroneous change in two consecutive bit values, followed by two consecutive correct bit values, and then followed by an erroneous change in two consecutive bit values.

4. The method of claim 1, wherein the error event is of the form ±{+−}, ±{+−+}, ±{+−+−}, ±{+−+−+}, ±{+−+−+−}, or ±{+−0+−}, wherein ±{+−} indicates an erroneous change in two consecutive bit values, ±{+−+} indicates an erroneous change in three consecutive bit values, ±{+−+−} indicates an erroneous change in four consecutive bit values, ±{+−+−+} indicates an erroneous change in five consecutive bit values, ±{+−+−+−} indicates an erroneous change in six consecutive bit values, and ±{+−0+−} indicates an erroneous change in two consecutive bit values, followed by one correct bit value, and then followed by an erroneous change in two consecutive bit values.

5. The method of claim 1, wherein the error event comprises an even number of erroneous bits.

6. The method of claim 1, wherein each of the parity check sum patterns corresponds to a single dominant error event.

7. The method of claim 6, wherein a period of each parity check sum pattern is equal to a length of the corresponding dominant error.

8. The method of claim 6, wherein at least two parity check sum patterns in the parity check matrix correspond to a same dominant error event, and wherein one of the at least two parity check sum patterns comprises a shifted version of the other parity check sum pattern.

9. The method of claim 1,
wherein n is equal to a length of a data word, and
wherein each of the rows of the parity check matrix further includes one or more parity bits appended to the corresponding periodic parity check sum pattern of the row.

10. The method of claim 9, wherein the echelon canonical form is imposed on the parity check matrix while ensuring error detection capability in a parity zone defined by the one or more parity bits.

11. The method of claim 9, wherein the one or more parity bits appended to the periodic parity check sum patterns of the rows form an identity matrix.

12. The method of claim 1, further comprising detecting the codeword from a data sequence transmitted via the communication system.

13. The method of claim 1, wherein the codeword comprises a data word encoded with one or more parity bits.

14. The method of claim 1, further comprising determining a type of the detected error event and a location of the detected error event in the codeword.

15. The method of claim 14, wherein determining the type and the location of the detected error event comprises:
applying the codeword to one or more error correlation filters that correspond to the one or more dominant error events;
selecting a maximum likelihood error event based on output of the one or more error correlation filters; and
selecting a position that corresponds to the selected error event.

16. The method of claim 15, wherein applying the codewords to the error correlation filters comprise activating only the error correlation filters that correspond to the type of the detected error event indicated by the parity check equations.

17. The method of claim 14, further comprising correcting the detected error event based on the type of the detected error event and the location of the detected error event in the codeword.

18. The method of claim 1, wherein the communication system comprises a data recording system.

19. The method of claim 1, wherein the communication system comprises a perpendicular magnetic data recording system.

20. The method of claim 1, wherein the communication system comprises a magnetic recording system, and the error detection code corresponds to one or more dominant error events prescribed for the magnetic recording system.

21. The method of claim 1, further comprising reading data from a magnetic medium, encoding the data, and detecting the codeword from the encoded data, wherein the error detection code corresponds to one or more dominant error events prescribed for a magnetic recording system.

22. The method of claim 1, wherein n is equal to a length of the codeword.

23. A processor comprising an error event detector to detect an occurrence of an error event in a codeword with an error detection code that corresponds to one or more dominant error events prescribed for a communication system, wherein the error detection code uses a parity check matrix that includes a plurality of rows of periodic parity check sum patterns for detecting the error events, each of the periodic parity check sum patterns comprising a repetitive binary pattern with a length of n bits.

24. The processor of claim 23, wherein the error event detector detects the occurrence of the error event at least partially within the codeword.

25. The processor of claim 23, wherein the error event is of the form ±{+−}, ±{+−0+−}, ±{+−0+−0+−}, or ±{+−0 0+−}, wherein ±{+−} indicates an erroneous change in two consecutive bit values, ±{+−0+−} indicates an erroneous change in two consecutive bit values, followed by a correct bit value, and then followed by an erroneous change in two consecutive bit values, ±{+−0+−0+−} indicates an erroneous change in two consecutive bit values, followed by a correct bit value, followed by an erroneous change in two consecutive bit values, followed by a correct bit value, followed by an erroneous change in two consecutive bit values, and ±{+−0 0+−} indicates an erroneous change in two consecutive bit values, followed by two consecutive correct bit values, and then followed by an erroneous change in two consecutive bit values.

26. The processor of claim 23, wherein the error event is of the form ±{+−}, ±{+−+}, ±{+−+−}, ±{+−+−+}, ±{+−+−+−}, or ±{+−0+−}, wherein ±{+−} indicates an erroneous change in two consecutive bit values, ±{+−+} indicates an erroneous change in three consecutive bit values, ±{+−+−} indicates an erroneous change in four consecutive bit values, ±{+−+−+} indicates an erroneous change in five consecutive bit values, ±{+−+−+−} indicates an erroneous change in six consecutive bit values, and ±{+−0+−} indicates an erroneous change in two consecutive bit values, followed by one correct bit value, and then followed by an erroneous change in two consecutive bit values.

27. The processor of claim 23, wherein each of the parity check sum patterns corresponds to a single dominant error event.

28. The processor of claim 27, wherein a period of each parity check sum pattern is equal to a length of the corresponding dominant.

29. The processor of claim 23,
wherein n is equal to a length of a data word, and
wherein each row of the parity check further includes one or more parity bits appended to the corresponding parity check sum pattern of the row.

30. The processor of claim 29, wherein the one or more parity bits appended to the periodic parity check sum patterns of the rows form an identity matrix.

31. The processor of claim 29, wherein the echelon canonical form is imposed on the parity check matrix while ensuring error detection capability in a parity zone defined by the one or more parity bits.

32. The processor of claim 29, wherein at least two parity check sum patterns correspond to a same dominant error event, and wherein one of the at least two parity check sum patterns comprises a shifted version of the other parity check sum pattern.

33. The processor of claim 23, further comprising one or more error correlation filters to determine a type of the detected error event and a location of the detected error event in the codeword, wherein the one or more error correlation filters correspond to the one or more dominant error events.

34. The processor of claim 33, further comprising a maximum value selector to select a maximum likelihood error event and a corresponding position based on output of the one or more error correlation filters.

35. The processor of claim 33, further comprising a correction module to correct the detected error event based on the type of the detected error event and the location of the detected error event in the codeword.

36. The processor of claim 33, wherein applying the codewords to the error correlation filters comprise activating only the error correlation filters that correspond to the type of the detected error event indicated by the parity check equations.

37. The processor of claim 23, wherein the communication system comprises a recording system.

38. The processor of claim 37, wherein the recording system comprises a perpendicular recording system.

39. The processor of claim 23, wherein the communication system comprises a magnetic recording system, and the error detection code corresponds to one or more dominant error events prescribed for the magnetic recording system.

40. The processor of claim 23, wherein the communication system comprises a magnetic recording system, the processor is coupled to receive encoded data from an encoding module that encodes data read from a magnetic medium, and the processor is configured to detect the codeword from the encoded data.

41. The processor of claim 23, wherein n is equal to a length of the codeword.

42. A computer-readable medium comprising instructions that when executed in a processor detect an occurrence of an error event in a codeword with an error detection code that corresponds to one or more dominant error events prescribed for a communication system, wherein the error detection code uses a parity check matrix that includes a plurality of rows of periodic parity check sum patterns for detecting the error events, each of the periodic parity check sum patterns comprising a repetitive binary pattern with a length of n bits.

43. The computer-readable medium of claim 42, further comprising instructions that when executed in the processor:
    apply the codeword to one or more error correlation filters that correspond to the one or more dominant error events;
    select a maximum likelihood error event based on output of the one ore more error correlation filters to determine a type of the detected error event; and
    select a position that corresponds to the selected error event to determine a location of the detected error event in the codeword.

44. The computer-readable medium of claim 43, wherein applying the codewords to the error correlation filters comprise activating only the error correlation filters that correspond to the type of the detected error event indicated by the parity check equations.

45. The computer-readable medium of claim 42, further comprising instructions that when executed in the processor correct the detected error event based on the type of the detected error event and the location of the detected error event in the codeword.

46. The computer-readable medium of claim 42, wherein the communication system comprises a magnetic recording system, and the error detection code corresponds to one or more dominant error events prescribed for the magnetic recording system.

47. The computer-readable medium of claim 42, wherein the communication system comprises a magnetic recording system, and wherein the instructions cause the processor to receive encoded data from an encoding module that encodes data read from a magnetic medium, and detect the codeword from the encoded data.

* * * * *

UNITED STATES PATENT AND TRADEMARK OFFICE
CERTIFICATE OF CORRECTION

PATENT NO. : 7,484,167 B2
APPLICATION NO. : 11/169159
DATED : January 27, 2009
INVENTOR(S) : Jaekyun Moon and Jihoon Park It is certified that error appears in the above-identified patent and that said Letters Patent is hereby corrected as shown below:

In the Specification

Background, Column 1, line 17: says "modem communication", should say -- modern communication --

Detailed Description, Column 6, line 33: says "35{+ -}", should say -- ±{+ -} --

Detailed Description, Column 12, line 56: says

" $H(D) = [[D^{s_1}h_{j_1}(D)]_n, [D^{s_2}h_{j_2}(D)]_n, [D^{s_3}h_j^3(D)]_n, \ldots, [D^{s_r}h_{j_r}(D)]_n]^T$ " should say -- $H(D) = \left[\left[D^{s_1}h_{j_1}(D)\right]_n, \left[D^{s_2}h_{j_2}(D)\right]_n, \left[D^{s_3}h_{j_3}(D)\right]_n, \cdots, \left[D^{s_r}h_{j_r}(D)\right]_n\right]^T$ --

Detailed Description, Equation 17, Column 16, line 1: says

" $P_{sector} = 1 - \sum_{x_1} \cdots \sum_{x_k} f_{X_1, \ldots, X_k}(x_1, \ldots, x_k)$ "

should say

-- $P_{sector} = 1 - \sum_{x_1} \cdots \sum_{x_k} f_{X_1, \cdots, X_k}(x_1, \cdots, x_k)$ --

Detailed Description, Column 16, line 8: says " $\sum_{i=1}^{k} j * x_i \leq t$ " should say -- $\sum_{i=1}^{k} i * x_i \leq t$ --

Signed and Sealed this
Fifth Day of July, 2016

Michelle K. Lee
*Director of the United States Patent and Trademark Office*

CERTIFICATE OF CORRECTION (continued)
U.S. Pat. No. 7,484,167 B2

In the Claims

Claim 43, Column 20, line 16: says "one ore more", should say -- one or more --